United States Patent
Cai et al.

(10) Patent No.: US 9,666,267 B2
(45) Date of Patent: May 30, 2017

(54) STRUCTURE AND METHOD FOR ADJUSTING THRESHOLD VOLTAGE OF THE ARRAY OF TRANSISTORS

(71) Applicant: International Business Machines Corporation, Armonk, NY (US)

(72) Inventors: Jin Cai, Cortlandt Manor, NY (US); Kangguo Cheng, Guilderland, NY (US); Robert H. Dennard, Croton-on-Hudson, NY (US); Ali Khakifirooz, Los Altos, CA (US); Tak H. Ning, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/266,519

(22) Filed: Sep. 15, 2016

(65) Prior Publication Data

US 2017/0004873 A1    Jan. 5, 2017

Related U.S. Application Data

(62) Division of application No. 14/467,165, filed on Aug. 25, 2014, now Pat. No. 9,484,464, which is a division of application No. 13/036,243, filed on Feb. 28, 2011, now Pat. No. 8,859,302.

(51) Int. Cl.
| | | |
|---|---|---|
| *H01L 21/66* | (2006.01) | |
| *G11C 11/418* | (2006.01) | |
| *G11C 29/50* | (2006.01) | |
| *H01L 27/12* | (2006.01) | |
| *H01L 27/11* | (2006.01) | |
| *H01L 29/06* | (2006.01) | |
| *H01L 21/84* | (2006.01) | |

(52) U.S. Cl.
CPC ...... *G11C 11/418* (2013.01); *G11C 29/50004* (2013.01); *H01L 21/84* (2013.01); *H01L 27/1104* (2013.01); *H01L 27/1203* (2013.01); *H01L 29/0603* (2013.01); *G11C 2029/5004* (2013.01); *G11C 2029/5006* (2013.01)

(58) Field of Classification Search
CPC ...... H01L 21/84; H01L 27/12; H01L 27/1203
USPC ...................................... 257/14, 17, 18, 149
See application file for complete search history.

(56) References Cited

U.S. PATENT DOCUMENTS

| | | | |
|---|---|---|---|
| 6,984,842 B1 | 1/2006 | Nayfeh et al. | |
| 7,078,301 B2 | 7/2006 | Bojarczuk, Jr. et al. | |
| 7,135,370 B2 | 11/2006 | Baker | |
| 7,599,646 B2 | 10/2009 | Matayoshi | |
| 2004/0007734 A1 | 1/2004 | Kato et al. | |
| 2009/0212363 A1 | 8/2009 | Krivokapic | |

(Continued)

*Primary Examiner* — Matthew E Warren
(74) *Attorney, Agent, or Firm* — Scully, Scott, Murphy & Presser, P.C.; Steven J. Meyers

(57) ABSTRACT

A semiconductor device including a charge storage element present in a buried dielectric layer of the substrate on which the semiconductor device is formed. Charge injection may be used to introduce charge to the charge storage element of the buried dielectric layer that is present within the substrate. The charge that is injected to the charge storage element may be used to adjust the threshold voltage (Vt) of each of the semiconductor devices within an array of semiconductor devices that are present on the substrate.

20 Claims, 6 Drawing Sheets

(56) References Cited

U.S. PATENT DOCUMENTS

| | | | |
|---|---|---|---|
| 2009/0230461 A1* | 9/2009 | Lee | B82Y 10/00 257/325 |
| 2011/0001184 A1* | 1/2011 | Andrieu | H01L 21/84 257/324 |
| 2011/0115553 A1* | 5/2011 | Cai | H01L 21/84 327/537 |

* cited by examiner

STRUCTURE AND METHOD FOR ADJUSTING THRESHOLD VOLTAGE OF THE ARRAY OF TRANSISTORS

BACKGROUND

The present disclosure relates to semiconductor structures and devices. More particularly, the present disclosure relates to adjusting threshold voltage in semiconductor devices.

Process variations in semiconductor device manufacturing can lead to wafer-to-wafer and die-to-die variation. In the past, production binning has been used to ship to different markets. However, increases in the variation of semiconductor devices in future technology nodes makes binning less effective. Back gating can be used to tune the semiconductor devices after the wafer is fabricated. However, this requires that an analog voltage is applied to the back gate during the operation of the semiconductor devices. Disadvantageously, this typically requires extra circuitry to measure the leakage and apply proper voltage to the back-gate as the semiconductor device is being operated.

SUMMARY

In one embodiment, a method of adjusting threshold voltage is provided, in which the threshold voltage of the at least two semiconductor devices is adjusted by the charge of electron and hole charge carriers that are stored within a charge storage element that is contained within the dielectric layer of a semiconductor on insulator (SOI) substrate. In one embodiment, the method of adjusting threshold voltage may include providing at least two semiconductor devices on a substrate. The substrate may include a base semiconductor layer, a dielectric layer containing the charge storage element on the base semiconductor layer, and a semiconductor on insulator (SOI) layer on the dielectric layer. The at least two semiconductor devices may include a gate structure on a channel region of the SOI layer, and a source region and a drain region on opposing sides of the channel region. A test electrical property of the semiconductor device is measured. At least one of a voltage to the source region and the drain region, a voltage to the gate structure, and a voltage to the base semiconductor layer is applied until a charge is collected in the charge storage element of the dielectric layer for a first time period. The charge that is collected in the charge storage element adjusts the test electrical property of the semiconductor device towards a target electrical property.

In another aspect, a method of adjusting the threshold voltage (Vt) of a semiconductor device of a memory structure is provided, in which the threshold voltage of the semiconductor devices may be adjusted by a charge of electron and hole charge carriers that are stored within a charge storage element that is contained within the dielectric layer of a semiconductor on insulator (SOI) substrate on which the memory device is formed. In one embodiment, a method of adjusting threshold voltage in a memory device may include providing an SRAM device on a substrate that includes at least two p-type pull up transistors, at least two n-type pull down transistors, and at least two pass gate transistors. The at least two p-type pull up transistors, and the at least two n-type pull down transistors provide a storage cell, and each of the at least two pass gate transistors provides access to the storage cell. Each of the at least two p-type pull up transistors and the at least two n-type pull down transistors includes a charge storage element present in a buried dielectric layer of the substrate. A test electrical property is measured for at least one of the at least two p-type pull up transistors and the at least two n-type pull down transistors. To adjust the test electrical property towards a target electrical property, charge is collected in the charge storage element of the dielectric layer. The charge may be collected in the charge storage element by applying at least one of a voltage to the bit line (BL) to source/drain region of a first pass gate transistor, a voltage to the bit line complement (BLC), a voltage to a word line (WL) to at least one of the at least two pass gate transistors, a positive supply voltage (VDD) to the at least two p-type pull up transistors, a negative supply voltage (VSS) to the at least two n-type pull down transistors, and a voltage to the substrate.

In another aspect, a semiconductor device is provided that includes a charge storage element for adjusting the threshold voltage of the semiconductor device. The semiconductor device typically includes a base semiconductor substrate, a dielectric layer present on the base semiconductor layer, and a semiconductor on insulator (SOI) layer on the dielectric layer. A gate structure is present on a device channel region of the semiconductor on insulator (SOI) layer, and source and drain regions are present on opposing sides of a channel region. The charge storage element is present in the dielectric layer, wherein the charge storage element contains electron charge carriers or hole charge carriers. The quantity of electron or hole charge carriers that are present in the charge storage element is selected to adjust the threshold voltage of the semiconductor device to a target value.

DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1A:
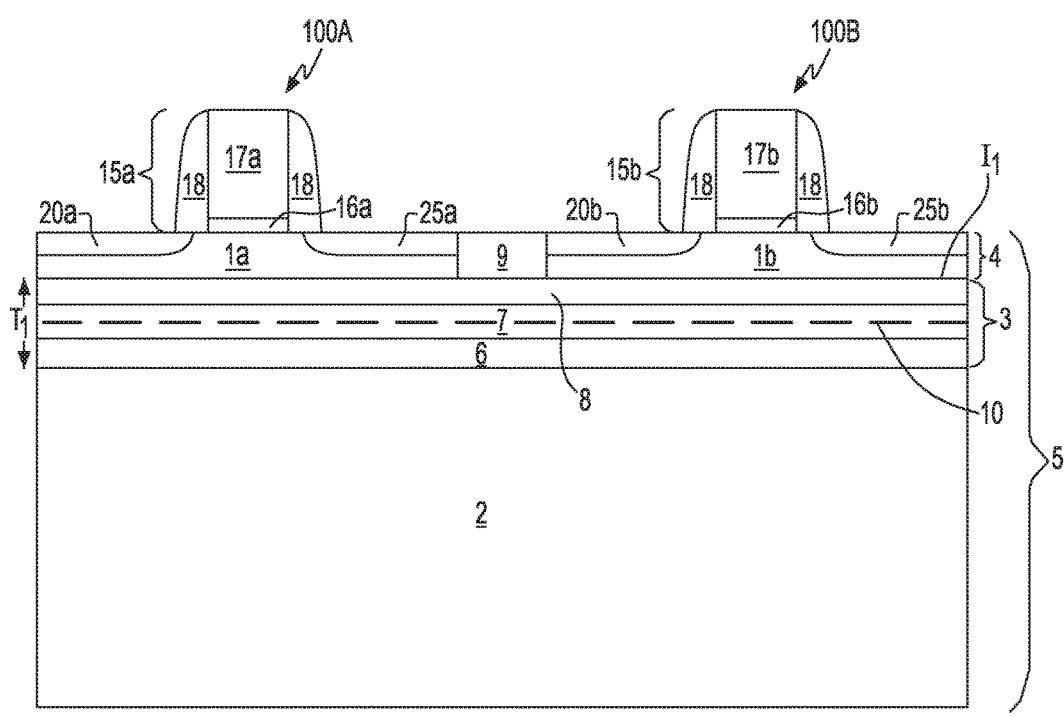
FIG. 1A is a side cross-sectional view depicting one embodiment of a semiconductor device on a semiconductor on insulator (SOI) substrate, in which the threshold voltage of the semiconductor device is adjusted by a charge provided by at least one of electron charge carriers and hole charge carriers that are stored within a charge storage element composed of an oxide/nitride/oxide dielectric stack that is present within the dielectric layer of the SOI substrate, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In one embodiment, a semiconductor device is provided that includes a charge storage element that is present in the dielectric layer, e.g., buried dielectric layer, of a semiconductor on insulator (SOI) substrate, on which the semiconductor device is formed. As used herein, "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor determine the conductivity type of the semiconductor, e.g., n-type or p-type conductivity.

A "charge storage element" is a structure of a semiconductor device that retains charge carriers that have been injected to the charge storage element as power has been applied to the semiconductor device, wherein the charge carriers are retained in the charge storage element after the application of the power has been removed. The phenomena by which the charge storage element retains charge carriers is similar to charge trapping as employed in SONOS (silicon-oxide-nitride-oxide-silicon) non-volatile flash memory. In some examples and to provide a charge storage function, the conduction band of the material that provides the charge storage element is lower than the conduction band of surrounding material, e.g., silicon nitride sandwiched between two silicon dioxide layers.

Typically, the charge carriers include electrons, which carry negative electric charge (e.g., $-1.60217646 \times 10^{-19}$ coulombs), and/or traveling vacancies (hereafter referred to as "holes"), which carry a positive charge equal in magnitude to that of an electron.

Charge injection may be used to introduce charge carriers, e.g., at least one of electron charge carriers and hole charge carriers, to the charge storage element of the dielectric layer that is present within the substrate. The charge that is injected to the charge storage element may be used to adjust the threshold voltage (Vt) of each of the semiconductor devices that are present within an array of semiconductor devices that are on the substrate. "Charge injection" is the movement of the charge carriers, e.g., electron charge carriers and hole charge carriers, from a source region, drain region, channel region, or a well region within a substrate, to the charge storage element. In some embodiments, charge injection may be provided by Fowler-Nordheim (FN) tunneling, hot carrier injection, and/or avalanche injection. In one example, Fowler-Nordheim tunneling a relatively high electric voltage, typically 10 V or more, is applied across the dielectric containing the charge storage elements. As a result of the high electric filed across the dielectric, some charge carries, e.g. electrons or holes, will tunnel from the semiconductor into the charge storage element. In one example, in hot carrier injection, a relatively high voltage, typically 1.5 V or more, is applied across the transistors so that carriers gain energy as they travel from the source to the drain of the transistors. A relatively large voltage, which is smaller that what is required for FN tunneling, is applied across the dielectric containing the charge storage elements. Some of the carriers that gained enough energy ("hot"

carriers) will tunnel to the charge storage element and stored there. In on example, in avalanche injection, similar to hot carrier injection, a relatively high voltage, typically 1.5V or more, is applied across the transistors so that the carriers gain significant energy as they travel from the source to the drain. These "hot" carriers will result in the so-called impact ionization near the drain, in which a hot carrier "hits" a semiconductor atom and generates a new electro-hole pair. A relatively high voltage, but with opposite polarity of what is used in hot carrier injection, is applied across the dielectric containing the charge storage element. Some of the carriers generated through the impact ionization mechanism will tunnel into the charge storage element. Regardless of the tunneling method used, the carriers that tunnel to the charge storage element stay in there even after the electric voltage is removed as long as another high electric voltage is applied so that they tunnel back to the semiconductor and/or are compensated with a tunneling of charge carriers with opposing polarity. The threshold voltage of the transistor that is located above the charge storage element is changed depending on the polarity and magnitude of the charges that are stored. More precisely, electrons stored in the charge storage element decrease the threshold voltage (Vt) of NFETs and increase the threshold voltage of PFETs, whereas holes stored in the charge storage element increase NFET Vt and decrease PFET Vt. The change in the threshold voltage compared to a neutral state where there is no charge present on the charge storage element depends linearly on the magnitude of the stored charge.

In some embodiments, by applying the proper bias, e.g., voltage, to each of the semiconductor devices in the array, and by applying the proper bias to the substrate, for a given period of time, charge carriers are injected into the charge storage element so that the threshold voltage (Vt) of the semiconductor devices may be shifted, i.e., adjusted, to a desired value, e.g., target electrical property. As used herein, "threshold voltage (Vt)" is the lowest attainable gate voltage that will turn on a semiconductor device, e.g., transistor, by making the channel region of the device conductive. The adjustment to the threshold voltage (Vt) is retained after the bias has been removed from the semiconductor device, because the charge carriers are retained within the charge storage element.

Figure 1B:
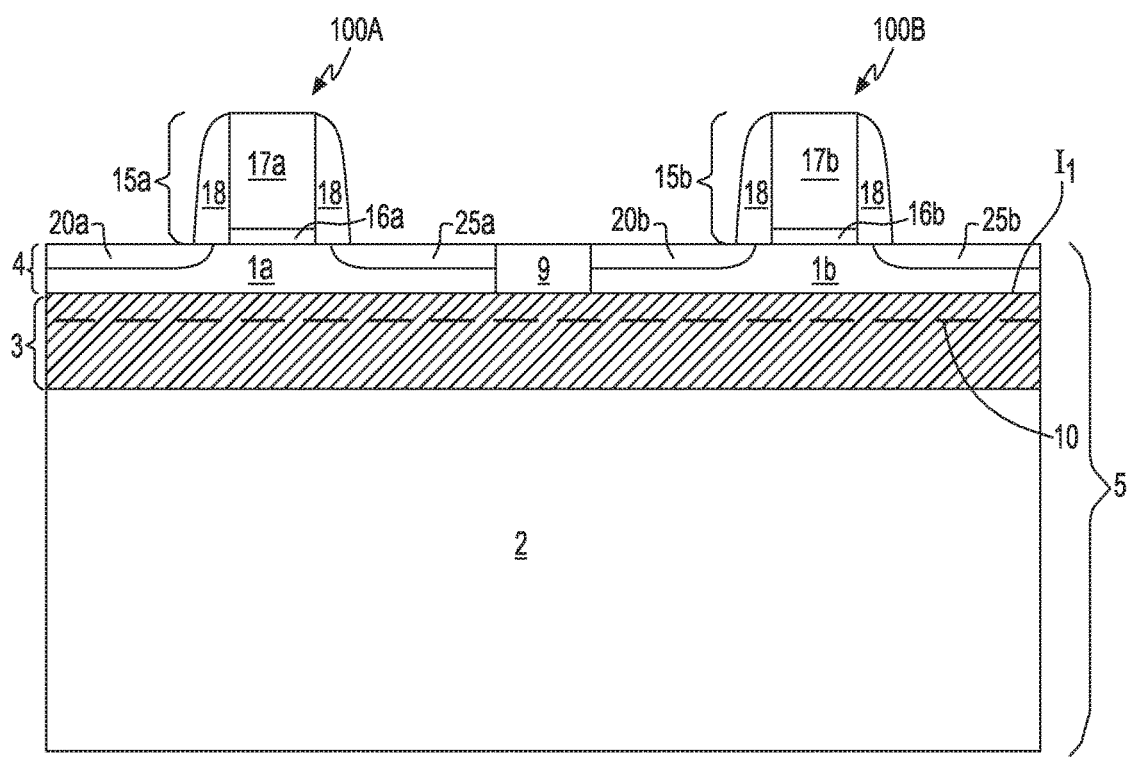
FIG. 1B is a side cross-sectional view depicting one embodiment of a semiconductor device on a semiconductor on insulator (SOI) substrate, in which the threshold voltage of the semiconductor device is adjusted by a charge provided by at least one of electron charge carriers and hole charge carriers that are stored within a charge storage element that is provided by a high-k dielectric material that is present within the dielectric layer of the SOI substrate, in accordance with the present disclosure.
Figure 1C:
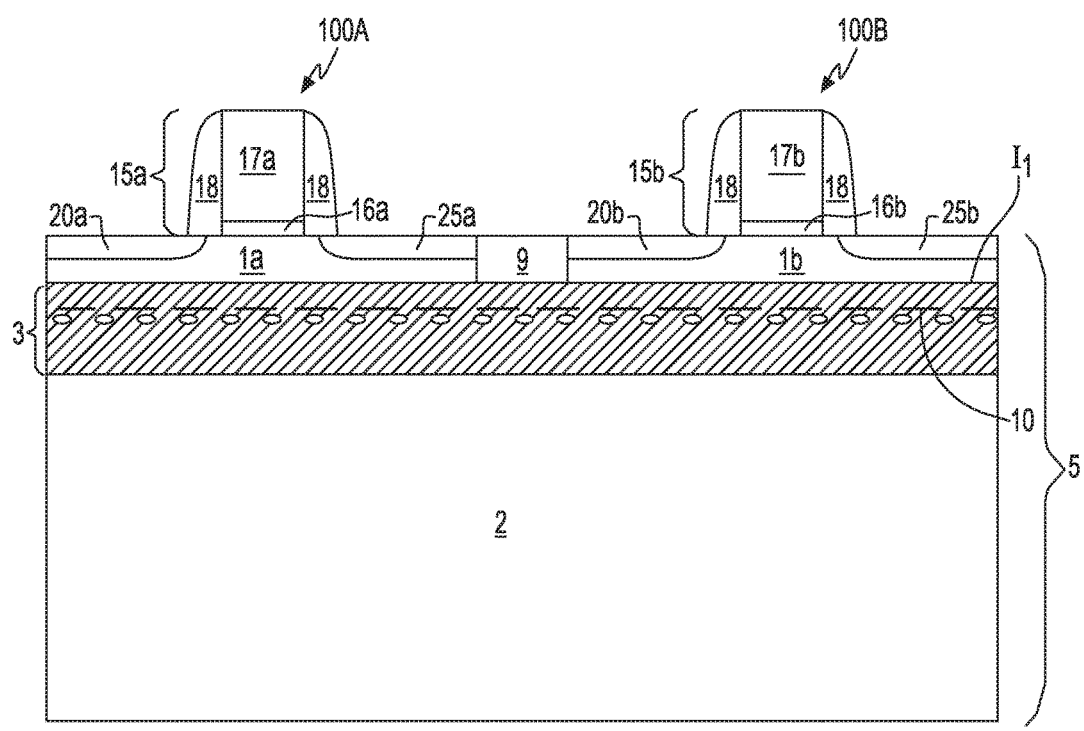
FIG. 1C is a side cross-sectional view depicting one embodiment of a semiconductor device on a semiconductor on insulator (SOI) substrate, in which the threshold voltage of the semiconductor device is adjusted by a charge provided by at least one of electron charge carriers and hole charge carriers that are stored within a charge storage element provided by a nano-crystal layer that is present within the dielectric layer of the SOI substrate, in accordance with the present disclosure.

FIGS. 1A-1C depict one embodiment of semiconductor devices 100A, 100B on a semiconductor on insulator (SOI) substrate 5, in which the threshold voltage (Vt) of the semiconductor devices 100A, 100B is adjusted by using a charge storage element 10 within the dielectric layer 3 of the SOI substrate 5. In the embodiment depicted in FIG. 1, the charge storage element 10 is proximate to the interface I1 of the semiconductor on insulator (SOI) layer 4 and the dielectric layer 3 of the SOI substrate 5. In one embodiment, an n-type semiconductor device 100A and a p-type semiconductor device 100B are present on the SOI substrate 5. The SOI substrate 5 includes an SOI layer 4, a dielectric layer 3 (also referred to as a buried dielectric layer), and a base semiconductor layer 2. The portion of the SOI layer 4 containing the n-type semiconductor device 100A is separated from the portion of the SOI layer 4 containing the p-type semiconductor device 100B by an isolation region 9, such as a shallow trench isolation (STI) region.

The SOI layer 4 may comprise any semiconducting material including, but not limited to, Si, strained Si, SiC, SiGe, SiGeC, Si alloys, Ge, Ge alloys, GaAs, InAs, and InP, or any combination thereof. The SOI layer 4 may be thinned to a desired thickness by planarization, grinding, wet etch, dry etch, oxidation followed by oxide etch, or any combination thereof. One method of thinning the SOI layer 4 is to oxidize silicon by a thermal dry or wet oxidation process, and then wet etch the oxide layer using a hydrofluoric (HF) acid mixture. This process can be repeated to achieve the desired thickness. In one embodiment, the SOI layer 4 has a thickness ranging from 1.0 nm to 20.0 nm. In another embodiment, the SOI layer 4 has a thickness ranging from 1.0 nm to 10.0 nm. In a further embodiment, the SOI layer 4 has a thickness ranging from 3.0 nm to 8.0 nm.

In one embodiment, the dielectric layer 3 (also referred to as a buried dielectric layer 3) that is present underlying the SOI layer 4 and atop the base semiconductor layer 2 may be composed of a dielectric material or a stack of dielectric material layers. The dielectric layer 3 contains the charge storage element 10. Non-limiting examples of the material suitable for uses as dielectric layer 13 of the dielectric layer 3 include oxides, nitrides and oxynitrides, particularly of silicon, but oxides, nitrides and oxynitrides of other elements are not excluded. The dielectric layer 3 may comprise a crystalline or a non-crystalline dielectric material. The total thickness T1 of the dielectric layer 3 may range from 10.0 nm to 200.0 nm. In another embodiment, the dielectric layer 3 has a total thickness T1 ranging from 10.0 nm to 50.0 nm.

FIG. 1A depicts one embodiment of a dielectric layer 3 of an SOI substrate 5, in which the charge storage element 10 is provided by the nitride layer 7 of an oxide/nitride/oxide dielectric stack. The oxide layers, i.e., first oxide layer 6 and second oxide layer 8, of the dielectric stack may be provided by silicon oxide. In one example, the first oxide layer 6 and the second oxide layer 8 are each composed of silicon oxide. The first oxide layer 6 has a thickness ranging from 5 nm to 200 nm and the second oxide layer 8 has a thickness ranging from 2 nm to 10 nm. The nitride layer 7 of the dielectric stack may be provided by silicon nitride. In one example, the nitride layer 7 is composed of silicon nitride and has a thickness ranging from 2 nm to 10 nm. In one embodiment, the second oxide layer 8 is in direct contact with the SOI layer 4 and the nitride layer 7 that provides the charge storage element 10. In one embodiment, the first oxide layer 6 is in direct contact with and between the nitride layer 7 and the base semiconductor layer 2. In this embodiment, the nitride layer 7 of the oxide/nitride/oxide dielectric stack provides the charge trapping function that retains the electron and/or hole charge carriers for adjusting the threshold voltage of the semiconductor devices 100A, 100B. In one example in which the device is operating under a FN tunneling mechanism, the charge carriers, e.g., electron or hole charge carriers, tunnel through the second oxide layer 8 from at least one of the source region 20a, 20b, the drain region 25a, 25b, and the channel region 1a, 1b to the nitride layer 7. In one example, in which the device is operating under a hot carrier or avalanche injection mechanism, the charge carriers, e.g., electron or hole charge carriers, are generated from the channel region 1a, 1b near the drain regions 25a, 25b.

Each layer of the oxide/nitride/oxide dielectric stack may be formed using a deposition process, such as chemical vapor deposition (CVD). Chemical vapor deposition (CVD) is a deposition process in which a deposited species is formed as a result of chemical reaction between gaseous reactants at room temperature or greater, wherein the solid product of the reaction is deposited on the surface on which a film, coating, or layer of the solid product is to be formed. Variations of CVD processes suitable for depositing the first oxide layer 6, nitride layer 7, and the second oxide layer 8 include, but are not limited to, Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the first oxide layer 6, nitride layer 7, and the second oxide layer 8 may also be formed using spinning from solution, spraying from solution, and evaporation. The oxide/nitride/oxide dielectric stack may be formed after the base semiconductor layer 2 and before the SOI layer 4.

FIG. 1B depicts a dielectric layer 3 in which the charge storage element 10 is contained within a high-k dielectric material. The term "high-k" denotes a material having a dielectric constant that is greater than the dielectric constant of silicon oxide ($SiO_2$) at room temperature, i.e., 20° C. to 25° C. In one embodiment, the high-k dielectric material has a dielectric constant that is greater than 4.0, e.g., 4.1. In another embodiment, the high-k dielectric material has a dielectric constant greater than 7.0. In yet another embodiment, the high-k dielectric material has a dielectric constant ranging from 4.0 to 30. The dielectric constants mentioned herein are relative to a vacuum at room temperature, i.e., 20° C. to 25° C.

In one embodiment, the high-k dielectric material may be deposited directly onto the upper surface of the base semiconductor layer 2, wherein the SOI layer 4 is then bonded directly on the upper surface of the high-k dielectric material. In this embodiment, the dielectric layer 3 is composed entirely of the high-k dielectric material, as depicted in FIG. 1B. In another embodiment, the high-k dielectric material may be present between layers of a low-k dielectric material, such as silicon oxide. Low-k dielectric materials have a dielectric constant less than 4. This embodiment is similar to the structure depicted in FIG. 1A, in which the nitride layer 7 is substituted with a high-k dielectric as described below.

Examples of high-k dielectric materials suitable for providing the charge storage element 10 include aluminum nitride (AlN), aluminum gallium nitride (AlGaN), aluminum oxide ($Al_2O_3$), hafnium oxide ($HfO_2$), hafnium oxynitride (HfON), and zirconium oxynitride (ZrON). In one embodiment, the high-k dielectric material that provides the charge storage element 10 is composed of aluminum nitride (AlN). Aluminum nitride (AlN) may be deposited using physical vapor deposition (PVD), such as sputtering or plating. As used herein, "sputtering" means a method of depositing a film of metallic material, in which a target of the desired material, i.e., source, is bombarded with particles, e.g., ions, which knock atoms from the target, and the dislodged target material deposits on the deposition surface. Examples of sputtering apparatus that may be suitable for depositing a charge storage element 10 composed of a high-k dielectric material, such as aluminum nitride, include DC diode type systems, radio frequency (RF) sputtering, magnetron sputtering, and ionized metal plasma (IMP) sputtering.

In one embodiment, a sputtering deposition process for depositing the aluminum nitride (AlN) includes applying high energy particles to strike a solid slab of high-purity aluminum target material, in which the high energy particles physically dislodge atoms of the aluminum to be deposited on the deposition surface. In one example, the ion energies of the high-energy particles, e.g., positive ions from an argon gas flow discharge, range from 500 eV to 5,000 eV. In one embodiment, by high-purity aluminum it is meant that the aluminum content of the target material is greater than 99.0 wt. %. "Incidental impurities" denote any contamination of the target, i.e., aluminum. Allowable ranges of impurities are less than 0.05 wt % for each impurity constituent and 0.15 wt % for total impurity content. The sputtered aluminum atoms from the aluminum target may migrate through a vacuum and deposit on the deposition surface. The nitrogen source may be introduced to the sputtering chamber as the sputtered atoms of aluminum are migrating towards the deposition surface.

Aluminum gallium nitride (AlGaN) may be produced using the above sputtering process with the addition of a gallium source, such as a single sputtering target composed of aluminum and gallium, or duel sputtering targets of aluminum and gallium. Aluminum gallium nitride (AlGaN) may also be formed using chemical vapor deposition, such as metal organic chemical vapor deposition. Aluminum oxide ($Al_2O_3$) may be formed using a similar sputtering process as the above-described process for forming aluminum nitride, with the exception that the nitride source is replaced with an oxygen source. Aluminum oxide ($Al_2O_3$) may also be formed using chemical vapor deposition, such as metal organic chemical vapor deposition.

In the embodiments, in which the high-k material that provides the charge storage element 10 is composed of hafnium oxide ($HfO_2$), hafnium oxynitride (HfON), and/or zirconium oxynitride (ZrON), the high-k material may be deposited using chemical vapor deposition (CVD). Examples of chemical vapor deposition that are suitable for this stage of the disclosure include Atmospheric Pressure CVD (APCVD), Low Pressure CVD (LPCVD) and Plasma Enhanced CVD (EPCVD), Metal-Organic CVD (MOCVD) and others.

FIG. 1C depicts a dielectric layer 3 that includes a nano-crystal layer as the charge storage element 10 that retains electron charge carriers and hole charge carriers for adjusting the threshold voltage of the semiconductor devices 100A, 100B formed on the SOI substrate 5. The dielectric layer 3 that the nano-crystal layer is present in may be composed of an oxide, nitride or oxynitride material. In one embodiment, the dielectric layer 3 is composed of silicon dioxide.

Nano-crystals are any material with at least one dimension <100 nm and have a single-crystal crystalline structure. Although the nano-crystals of the nano-crystal layer may not be formed in a uniform sphere, they can be described as having a general diameter of approximately 10 Å to 100 Å. In one embodiment, the diameter of the nano-crystals ranges from 10 Å to 40Å. The nano-crystals that provide the nano-crystal layer may be present across the entire width of the dielectric layer 3 in a concentration ranging from $10^{17} cm^3$ to $10^{20} cm^3$. In another embodiment, the nano-crystal layer are present only in a small region in the buried dielectric layer 3 and with an average distance from interface I1 that ranges from 2 nm to 10 nm in a concentration ranging from $10^{11} cm^2$ to $10^{13} cm^2$.

The nano-crystals may be implanted into the dielectric layer 3 once the dielectric layer 3 has been formed on the base semiconductor layer 2. In another embodiment, a layer of nano-crystals may be deposited onto a first portion of the dielectric layer 3, wherein a second portion of the dielectric layer 3 is then formed atop the layer of nano-crystals, hence encapsulating the layer of nano-crystals between the first and second portion of the dielectric layer 3. In some embodiments in which the nano-crystals are implanted into a previously formed dielectric layer 3, the implantation of the nanoparticles in the dielectric layer 3, e.g., silicon oxide, may be accomplished using ion implantation.

In the embodiments in which the layer of nano-crystals is deposited atop a portion of the dielectric layer 3, and a second portion of the dielectric layer 3 is formed atop and encapsulating the layer of nano-crystals, the nano-crystals may be deposited using chemical vapor deposition, spin on deposition or a combination thereof. Examples of chemical vapor deposition (CVD) processes that are suitable for this stage of the disclosure include Atmospheric Pressure CVD (APCVD), Low Pressure CVD (LPCVD), Plasma Enhanced CVD (EPCVD), Metal-Organic CVD (MOCVD) and others. Following the deposition of the nano-crystals, the second portion of the dielectric layer 3 is then deposited on the layer of nano-crystals, which encapsulates the layer of nano-crystals between the first and second portion of the dielectric layer 3. In yet another embodiment, the second portion of the dielectric layer 3 may be bonded to the layer of nano-crystals and the first portion of the dielectric layer 3 using direct wafer-bonding techniques.

In yet another embodiment, the nano-crystal layer is provided by nanocrystalline silicon (nc-Si), which may sometimes also be referred to as microcrystalline silicon (μc-Si). Nanocrystalline silicon is a form of porous silicon. It is an allotropic form of silicon with paracrystalline structure. It is similar to amorphous silicon (a-Si) in that it has an amorphous phase. Where they differ, however, is that nanocrystalline silicon (nc-Si) has small grains, i.e., nano-crystals, of crystalline silicon within the amorphous phase. When present, the nanocrystalline silicon can be formed by chemical vapor deposition, by rapid thermal anneal of amorphous silicon layers or by other known techniques. In this embodiment, the nanocrystalline silicon (nc-Si) may be present between layers of a low-k dielectric material, such as silicon oxide. This embodiment is similar to the structure depicted in FIG. 1A, in which the nitride layer 7 is substituted with nanocrystalline silicon (nc-Si).

Referring to FIGS. 1A-1C, the base semiconductor substrate 2 that is present beneath the charge storage element 10 containing dielectric layer 3 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. The base semiconductor substrate 2 may have a thickness ranging from about 100 nm to about 1.5 millimeters. The base semiconductor substrate 2 may be doped with a p-type dopant, such as boron, aluminum, gallium and indium. The concentration of the p-type dopant may range from $10^{15}$ atoms/cm$^3$ to $10^{20}$ atoms/cm$^3$.

In the embodiments depicted in FIGS. 1A-1C, the n-type semiconductor device 100A and p-type semiconductor device 100B are field effect transistors (FETs). A field effect transistor (FET) is a semiconductor device in which output current, i.e., source-drain current, is controlled by the voltage applied to a gate structure. A field effect transistor has three terminals, i.e., a gate structure 15a, 15b, a source region 20a, 20b and a drain region 25a, 25b.

The gate structure 15a, 15b is used to control output current, i.e., flow of carriers in the channel region 1a, 1b of the semiconducting device 100A, 100B, such as a field effect transistor (FET), through electrical or magnetic fields. The gate structure 15a, 15b may include at least one gate conductor 17a, 17b, and at least one gate dielectric 16a, 16b, in which the at least one gate dielectric 16a, 16b is present on the channel region 1a, 1b of the semiconductor device 100A, 100B. The channel region 1a, 1b is between the source region 20a, 20b and the drain region 25a, 25b of a field effect transistor (FET) that becomes conductive when the semiconductor device 100A, 100B is turned on.

The gate dielectrics 16a, 16b may comprise dielectric materials, such as oxides, nitrides and oxynitrides. The gate dielectric 16a of the n-type semiconductor device 100A may have the same or a different composition than the gate dielectric 16b of the p-type semiconductor device 100B. In one example, the gate dielectrics 16a, 16b may be composed of silicon oxide. In some embodiments, the gate dielectrics 16a, 16b may comprise generally higher dielectric constant dielectric materials having a dielectric constant that is greater than 4.0. Such higher dielectric constant dielectric materials may include, but are not limited to, hafnium oxides, hafnium silicates, zirconium oxides, lanthanum oxides, titanium oxides, barium-strontium-titantates (BSTs) and lead-zirconate-titanates (PZTs). The gate dielectrics 16a, 16b may be formed using thermal or plasma oxidation or nitridation methods, chemical vapor deposition methods (including atomic layer deposition methods) and physical vapor deposition methods. Typically, the gate dielectrics 16a, 16b have a thickness from 5 angstroms to 70 angstroms.

The gate conductors 17a, 17b may comprise materials including, but not limited to, metals, metal alloys, metal nitrides and metal silicides, as well as laminates thereof and composites thereof. The gate conductor 17a of the n-type semiconductor device 100A may have the same or a different composition than the gate conductor 17b of the p-type semiconductor device 100B. The gate conductors 17a, 17b may also comprise doped polysilicon and polysilicon-germanium alloy materials (i.e., having a dopant concentration from 1E18 to about 1E22 dopant atoms per cubic centimeter) and polycide materials (doped polysilicon/metal silicide stack materials). The gate conductors 17a, 17b may be formed using chemical vapor deposition (CVD) methods and physical vapor deposition (PVD) methods, such as, but not limited to evaporative methods and sputtering methods. Typically, the gate conductors 17a, 17b comprise a doped polysilicon material that has a thickness from 200 angstroms to 2000 angstroms. The gate conductors 17a, 17b when formed of the doped polysilicon material are typically formed using lithographic and ion implantation methods. In some embodiments, ion implantation steps may be employed to dope an NFET gate with n-type dopants and a PFET gate with p-type dopants.

In the embodiments in which the gate conductors 17a, 17b are composed of a metal, the metal may be provided by a work function metal layer. The gate conductor 17a of the n-type semiconductor device 100A may be an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.6 eV. In one embodiment, the n-type work function metal layer is composed of at least one of TiAl, TaN, TiN, HfN, HfSi, or combinations thereof.

In one embodiment, in which the semiconductor device 100B is a p-type device, the work function metal layer of the gate conductor 17b may be a p-type work function metal layer. As used herein, a "p-type work function metal layer" is a metal layer that effectuates a p-type threshold voltage shift. In one embodiment, the work function of the p-type work function metal layer 24 ranges from 4.6 eV to 5.2 eV. The term "p-type threshold voltage shift" as used herein means a shift in the Fermi energy of a p-type semiconductor device towards a valence band of silicon in the silicon containing substrate of the p-type semiconductor device 100B. A "valence band" is the highest range of electron energies where electrons are normally present at absolute zero.

The gate structure 15a, 15b may be formed using deposition, lithography and etching. In one embodiment, the gate structure 15a, 15b is formed using a gate first method. In another embodiment, the gate structure 15a, 15b is formed using a gate last method, which may also be referred to as a replacement gate process.

Spacers 18 may be formed adjacent to the gate structure 15a, 15b. The spacers 18 may be formed of a dielectric material, such as an oxide, nitride, or oxynitride material. The spacers 18 are typically formed before the source and drain region 20a, 20b, 25a, 25b, and have a width that determines the location of the dopant for the source and drain region 20a, 20b, 25a, 25b within the SOI substrate 5.

Still referring to FIGS. 1A-1C, the source region 20a, 20b, is the doped region in the semiconductor device 100A, 100B, in which majority carriers are flowing into the channel region 1a, 1b. The drain region 25a, 25b is the doped region of the semiconductor device 100A, 100B, located at the end of the channel region 1a, 1b, in which carriers are flowing out of the semiconductor device 100A, 100B through the drain region 25a, 25b. Each source region 20a, 20b, and each drain region 25a, 25b may include an extension dopant portion, a deep dopant portion (not shown) and a raised dopant portion (not shown). The deep dopant portions of the source region 20a, 20b, and the drain region 25a, 25b typically have the same dopant conductivity as the corresponding extension dopant portion, in which the dopant is present in the deep dopant portions at a greater concentration than the extension dopant portion. The extension dopant portion and the deep dopant portion of the source and drain regions 20a, 20b, 25a, 25b are typically implanted into the SOI substrate 5 using ion implantation, in which the implant energy for the deep dopant portion is greater than the extension dopant portion.

The raised dopant portion of the source and drain regions 20a, 20b, 25a, 25b may be epitaxially grown on the portion of the SOI substrate 5 including the extension dopant portion and the deep dopant portion. The raised dopant portion is typically doped with the same conductivity dopant as the corresponding extension dopant portion and the deep dopant portion. The raised dopant portion of the source and drain regions 20a, 20b, 25a, 25b has an upper surface that is vertically offset and above the upper surface of the channel region 1a, 1b. The source and drain regions 20a, 20b, 25a, 25b may further include halo implant regions (not shown). The halo implant regions are at the lower corner interface of the extension dopant portion and the channel region 1a, 1b. The halo implant regions have an opposite conductivity than the corresponding extension dopant portion.

The conductivity type of the dopant in the source and drain regions 20a, 20b, 25a, 25b dictates the conductivity type of the semiconductor device 100A, 100B. Conductivity-type denotes whether the source region 20 and the drain regions 25 of the semiconductor device have been doped with a p-type or n-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to, antimony, arsenic and phosphorous.

In one embodiment, the dopant concentration of n-type dopant for the extension portion of the source region 20a and the drain region 25a of the n-type semiconductor device 100A ranges from $1 \times 10^{19}$ atoms/cm$^3$ to $1 \times 10^{21}$ atoms/cm$^3$. In another embodiment, the dopant concentration of the extension portion of the source region 20a and the drain region 25a having n-type dopant ranges from $5 \times 10^{19}$ atoms/cm$^3$ to $5 \times 10^{20}$ atoms/cm$^3$. In one embodiment, the dopant concentration of p-type dopant for the extension portion of the source region 20b and the drain region 25b of the p-type semiconductor device 100B ranges from $1 \times 10^{19}$ atoms/cm$^3$ to $1 \times 10^{21}$ atoms/cm$^3$. In another embodiment, the dopant concentration of the extension portion of the source region 20b and the drain region 25b having p-type dopant ranges from $5 \times 10^{19}$ atoms/cm$^3$ to $5 \times 10^{20}$ atoms/cm$^3$.

In some embodiments, the channel region 1a, 1b of the n-type semiconductor device 100A and the p-type semiconductor device 100B are present in a well region of the SOI layer 4 having an opposite conductivity as the source and drain regions 20a, 20b, 25a, 25b. For example, in the n-type semiconductor device 100A, in which the source region 20a and drain region 25a are doped to an n-type conductivity, the channel region 1a may be doped to a p-type conductivity. The p-type dopant in the channel region 1a of the n-type semiconductor device 100A may be at least one of boron, aluminum, gallium and indium, which is present in a concentration ranging from $1 \times 10^{15}$ atoms/cm$^3$ to $1 \times 10^{19}$ atoms/cm$^3$. In another example, in the p-type semiconductor device 100B, in which the source region 20b and drain region 25b are doped to a p-type conductivity, the channel region 1b may be doped to an n-type conductivity. The n-type dopant in the channel region 1b of the n-type semiconductor device 100B may be at least one of antimony, arsenic and phosphorous, which is present in a concentration ranging from $1 \times 10^{15}$ atoms/cm$^3$ to $1 \times 10^{19}$ atoms/cm$^3$.

Although, FIGS. 1A-1C depicts a structure including both an n-type semiconductor device 100A and a p-type semiconductor device 100B on a single SOI substrate 5, the present disclosure is not limited to only this arrangement, because the principles of this disclosure are applicable to any number of combinations of semiconductor device types, number of semiconductor devices present on the substrate, and conductivities for the semiconductor devices.

The charge storage element 10 that is present in the dielectric layer 3 of the SOI substrate 5 may be employed to adjust the threshold voltage of the n-type and p-type semiconductor devices 100A, 100B. In one embodiment, the method of adjusting threshold voltage includes providing a semiconductor device, e.g., n-type semiconductor device 100A and/or p-type semiconductor device 100B, on an SOI substrate 5, and measuring a test electrical property of the semiconductor device. If the test electrical property does not meet a required standard for the device performance, e.g., target electrical property, a charge may be collected in the charge storage element 10 to adjust the electrical performance of the device. In one embodiment, the charge may be introduced to the charge storage element 10 by applying at least one of a voltage to the source region 20a, 20b and the drain region 25a, 25b, a voltage to the gate structure 15a, 15b, and a voltage to the base semiconductor layer 2. The voltage may be applied until a charge is collected in the charge storage element 10 of the dielectric layer 3 that adjusts the test electrical property of the device towards the target electrical property.

The "test electrical property" is an electrical property that is measured from either of the n-type semiconductor device 100A and the p-type semiconductor device 100B that is used to determine if adjustments are needed through the charge storage element 10. In one embodiment, the test electrical property is the threshold voltage (Vt), on current (I-on), or the off current (I-off), for the p-type or n-type semiconductor device 100A, 100B. In one embodiment, the "test electrical property" is measured by applying electrical voltages to the source, drain, and gate electrodes of the MOSFETs and measuring the current. For example, the on current (Ion) is measured by applying the so-called supply voltage to the gate and drain terminals and grounding the source terminal. The supply voltage is the voltage that is connected to the integrated circuit that is composed of the MOSFETs during its normal operation conditions. The supply voltage typically ranges from 0.5 V to 1.5 V. Typically, the test electrical property is the threshold voltage or can be correlated to the threshold voltage. The target electrical property is the standard for device performance at which the semiconductor device operates at its optimum level. The target electrical property is selected by device type and application. Similar to the test electrical property, the target electrical property may be the threshold voltage of a semiconductor device, or may be a measurement that can be correlated to the threshold voltage of a semiconductor device.

If the test electrical property is not within specification for the desired performance of the n-type or p-type semiconductor device 100A, 100B from which the test electrical property is measured, a charge may be stored in the charge storage element 10 to adjust the devices' performance. The charge is introduced to the charges storage element 10 by biasing the semiconductor device 100A, 100B in which the adjustment is desired. For example, to collect charge in the charge storage element a voltage may be applied to the source region 20a, 20b and the drain region 25a, 25b, a voltage to the gate structure 15a, 15b, and a voltage to the base semiconductor layer 2.

In one embodiment in which the test electrical property of the n-type semiconductor device 100A indicates that the threshold voltage is lower than the desired threshold voltage for operation, i.e., target threshold voltage, a charge provided by electron charge carriers may be stored in the charge storage element 10 to increase the threshold voltage towards the target threshold voltage. In one embodiment and to increase the threshold voltage of the n-type semiconductor device 100A, hot electron carriers tunnel from the channel region 1a of the SOI layer 4, to the charge storage element 10. By hot electron charge carriers it is meant that the electrons have energy significantly, typically 1.0 eV or more, higher than their equilibrium energy.

In one embodiment and to introduce and trap the electron charge carriers on the charge storage element 10, a voltage between −0.5 volts and 1.2 volts is applied to the gate structure 15a, a voltage ranging from 1.0 volts to 2.0 volts is applied to and the drain regions, 25a, the source region 20a is grounded, and a voltage ranging from 5.0 volts to 30.0 volts is applied to the base semiconductor layer 2. In one embodiment, the voltage applied to the base semiconductor layer 2 may range from 10.0 volts to 15.0 volts. In another embodiment, the voltage that is applied to the gate structure 15a ranges from 0.0 volts to 0.5 volts. The voltage that is applied to the drain region 25a is great enough to generate hot electron charge carriers. In one embodiment, the voltage that is applied to the drain region 25a ranges from 1.1 volts to 1.5 volts. In yet another embodiment, the voltage that is applied to the drain region, 25a ranges from 1.2 volts to 1.4 volts.

The time period that the voltage is applied to the drain region 25a, the voltage is applied to the gate structure 15a, and the voltage is applied to the base semiconductor layer 2 is typically dependent upon the degree of threshold voltage adjustment that is required for the n-type semiconductor device 100A to operate at the target threshold voltage. In one example in which the adjustment in threshold voltage is to increase the threshold voltage by a voltage ranging from 10 milli-volts to 0.2 volts, using the voltages described above, the time period that the voltages are applied to the drain region 25a, the gate structure 15a, and the base semiconductor layer 2 ranges from 1 micro-second to 1 second. In some embodiments, the charge density provided by the hot electron carriers that are trapped on the charge storage element 10 ranges from $10^{11} cm^{-2}$ to $5 \times 10^{12} cm^{-2}$.

In one embodiment in which the test electrical property of the p-type semiconductor device 100B indicates that the threshold voltage is lower than the desired threshold voltage for operation, i.e., target threshold voltage, a charge provided by hole charge carriers may be stored in the charge storage element 10 to increase the threshold voltage towards the target threshold voltage. In one embodiment and to increase the threshold voltage of the p-type semiconductor device 100B, hot hole carriers tunnel from the source and drain regions 20b, 25b of the SOI layer 4, to the charge storage element 10. By hot hole charge carriers it is meant that the holes have energy significantly higher, typically 1 eV or more, higher than their equilibrium energy.

In one embodiment and to introduce and trap the hole charge carriers on the charge storage element 10, a voltage of less ranging from −1.2 volts to 0.5 volts is applied to the gate structure 15b, a voltage ranging from −1.0 volts to −2.0 volts is applied to the drain regions 25b, the source region 20b is grounded, and a voltage ranging from −5.0 volts to −30.0 volts is applied to the base semiconductor layer 2. In one embodiment, the voltage applied to the base semiconductor layer 2 may range from −10.0 volts to −15.0 volts. In one embodiment, the voltage that is applied to the gate structure 15b ranges from −0.5 volts to 0.0 volts. The voltage that is applied to the drain region 25b is great enough to generate hot hole charge carriers. In one embodiment, the voltage that is applied to the drain region 25b ranges from −1.1 volts to −1.5 volts. In yet another embodiment, the voltage that is applied to the drain region, 25b ranges from −1.2 volts to −1.4 volts.

The time period that the voltage is applied to the drain region 25b, the voltage is applied to the gate structure 15b, and the voltage is applied to the base semiconductor layer 2 is typically dependent upon the degree of threshold voltage adjustment that is required for the p-type semiconductor device 100B to operate at the target threshold voltage. In one example in which the adjustment in threshold voltage is to increase the threshold voltage by a voltage ranging from 10 millivolts to 0.2 volts, using the voltages described above, the time period that the voltages are applied to the drain region 25b, the source region 20b, the gate structure 15b, and the base semiconductor layer 2 ranges from 1 microseconds to 1 seconds. In some embodiments, the charge density provided by the hot hole charge carriers that are trapped on the charge storage element 10 ranges from $10^{11} cm^{-2}$ to $5 \times 10^{12} cm^{-2}$.

In another embodiment, the n-type semiconductor device 100A is configured for avalanche operation. Avalanche operation denotes when the charge carriers are accelerated by an electric field to energies sufficient to free electron-hole pairs via collisions with bond electrons. In an n-type semiconductor device 100A configured for alavanche operation, the electron charge carriers are accelerated to a sufficient energy to create avalanche hole carriers, in which the avalanche hole carriers are trapped in the charge storage element 10.

In one embodiment in which the test electrical property of the avalanche n-type semiconductor device 100A indicates that the threshold voltage is greater than the desired threshold voltage for operation, i.e., target threshold voltage, a charge is provided by hole charge carriers in the charge storage element 10 to decrease the threshold voltage towards the target threshold voltage. In one embodiment and to decrease the threshold voltage of the n-type semiconductor device 100A, avalanche hole carriers tunnel to the charge storage element 10.

In one embodiment and to introduce and trap the avalanche hole carriers on the charge storage element 10 that is underlying the n-type semiconductor device 100A, a voltage greater than 0.0 volts is applied to the gate structure 15a, a voltage ranging from 1.0 volts to 2.0 volts is applied to the drain region 25a, and a voltage ranging from −5.0 volts to −30 volts, is applied to the base semiconductor layer 2. In another embodiment, the voltage that is applied to the gate structure 15a ranges from 0.5 volts to 1.0 volts. The voltage that is applied to the drain region 25a is great enough so that it generates hot electrons with enough energy to generate free electron-hole pairs through impact ionization. The energy of hot electrons needs to be at least higher than the band gap of the semiconductor material that forms the channel region. In one embodiment, the voltage that is applied to the drain region 25a ranges from 1.1 volts to 1.5 volts. In yet another embodiment, the voltage that is applied to the drain region 25a ranges from 1.2 volts to 1.4 volts.

The time period that the voltage is applied to the drain region 25a, the voltage is applied to the gate structure 15a, and the voltage is applied to the base semiconductor layer 2 is typically dependent upon the degree of threshold voltage adjustment that is required for the n-type semiconductor device 100A to operate at the target threshold voltage. In one example in which the adjustment in threshold voltage is to decrease the threshold voltage by a voltage ranging from 10 millivolts to 0.2 volts, using the voltages described above, the time period that the voltages are applied to the drain region 25a, the gate structure 15a, and the base semiconductor layer 2 ranges from 10 microseconds to 1 second. In some embodiments, the charge provided by the avalanche hole carriers that are produced by avalanche mechanisms in n-type semiconductor devices 100A that are trapped on the charge storage element 10 ranges from $10^{11}$ cm$^{-2}$ to $5 \times 10^{12}$ cm$^{-2}$.

In yet another embodiment, the p-type semiconductor device 100B is configured for avalanche operation. In a p-type semiconductor device 100B configured for alavanche operation, the hole charge carriers are accelerated to a sufficient energy to create avalanche electron carriers, in which the avalanche electron carriers are trapped in the charge storage element 10.

In one embodiment in which the test electrical property of the avalanche p-type semiconductor device 100B indicates that the threshold voltage is greater than the desired threshold voltage for operation, i.e., target threshold voltage, a charge provided by the avalanche electron carriers in the charge storage element 10 to decrease the threshold voltage towards the target threshold voltage. In one embodiment, and to increase the threshold voltage of the p-type semiconductor device 100B, avalanche electron carriers tunnel to the charge storage element 10.

In one embodiment and to introduce and trap the avalanche electron carriers on the charge storage element 10 that is underlying the p-type semiconductor device 100B, a voltage less than 0.0 volts, e.g., −0.5 volts, is applied to the gate structure 15b, a voltage ranging from −1.0 volts to −2.0 volts is applied to the source and drain regions 20b, 25b, and a voltage ranging from 5.5 volts to 30 volts is applied to the base semiconductor layer 2. In another embodiment, the voltage that is applied to the gate structure 15b ranges from −0.5 volts to −1.0 volts. The voltage that is applied to the source region and drain region 20b, 25b is great enough so that it generates hot holes with enough energy to generate free electron-hole pairs through impact ionization. The energy of hot holes needs to be at least higher than the band gap of the semiconductor material that forms the channel region. In one embodiment, the voltage that is applied to the drain region 25b ranges from −1.1 volts to −1.5 volts. In yet another embodiment, the voltage that is applied to the drain region 25b ranges from −1.2 volts to −1.4 volts.

The time period that the voltage is applied to the drain region 25b, the voltage is applied to the gate structure 15b, and the voltage is applied to the base semiconductor layer 2 is typically dependent upon the degree of threshold voltage adjustment that is required for the p-type semiconductor device 100B to operate at the target threshold voltage. In one example in which the adjustment in threshold voltage is to decrease the threshold voltage by a voltage ranging from 10 milivolts to 0.2 volts, using the voltages described above, the time period that the voltages are applied to the drain region 25b, the gate structure 15b, and the base semiconductor layer 2 ranges from 10 microseconds to 1 second. In some embodiments, the charge provided by the avalanche electron carriers that are produced by avalanche mechanisms in p-type semiconductor devices 100B that are trapped on the charge storage element 10 ranges from $10^{11}$ cm$^{-2}$ to $5 \times 10^{12}$ cm$^{-2}$.

It is noted that the measuring of the test electrical property and the application of the at least one of the voltage to the source region 20a, 20b and the drain region 25a, 25b, the voltage to the gate structure 15a, 15b, and the voltage to the base semiconductor layer 2 may be repeated as many times as necessary so that the charge collected in the charge storage element 10 is suitable to adjust the test electrical property, e.g., threshold voltage, to the target electrical property. In one embodiment, the test electrical property is measured for a first time before the applying of the at least one of the voltage to the source region 20a, 20b and the drain region 25a, 25b, the voltage to the gate structure 15a, 15b, and the voltage to the base semiconductor layer 2. Thereafter, the test electrical property is measured for at least a second time after at least a portion of the charge is collected in the charge storage element 10 to determine if the test electrical property is equal to the target electrical property. In the event that the test electrical property that is measured the second time is not equal to the target electrical property, at least a second time period is employed for the applying the voltage to the source region 20a, 20b and the drain region 25a, 25b, the applying of the voltage to the gate structure 15a, 15b, and the applying of the voltage to the base semiconductor layer 2 until a charge is collected in the charge storage element of the dielectric layer 3 that adjusts the test electrical property of the semiconductor device 100A, 100B to a target electrical property. The sequence may be repeated for any number of times until the target electrical property is reached.

FIGS. 1A-1C depict semiconductor devices 100A, 100B formed on an SOI substrate 5 that includes a charge storage element 10 that is at the center of the dielectric layer 3 of the SOI substrate 5, or is proximate to the interface I1 of the SOI layer 4 and the dielectric layer 3 of the SOI substrate 5.

Figure 2:
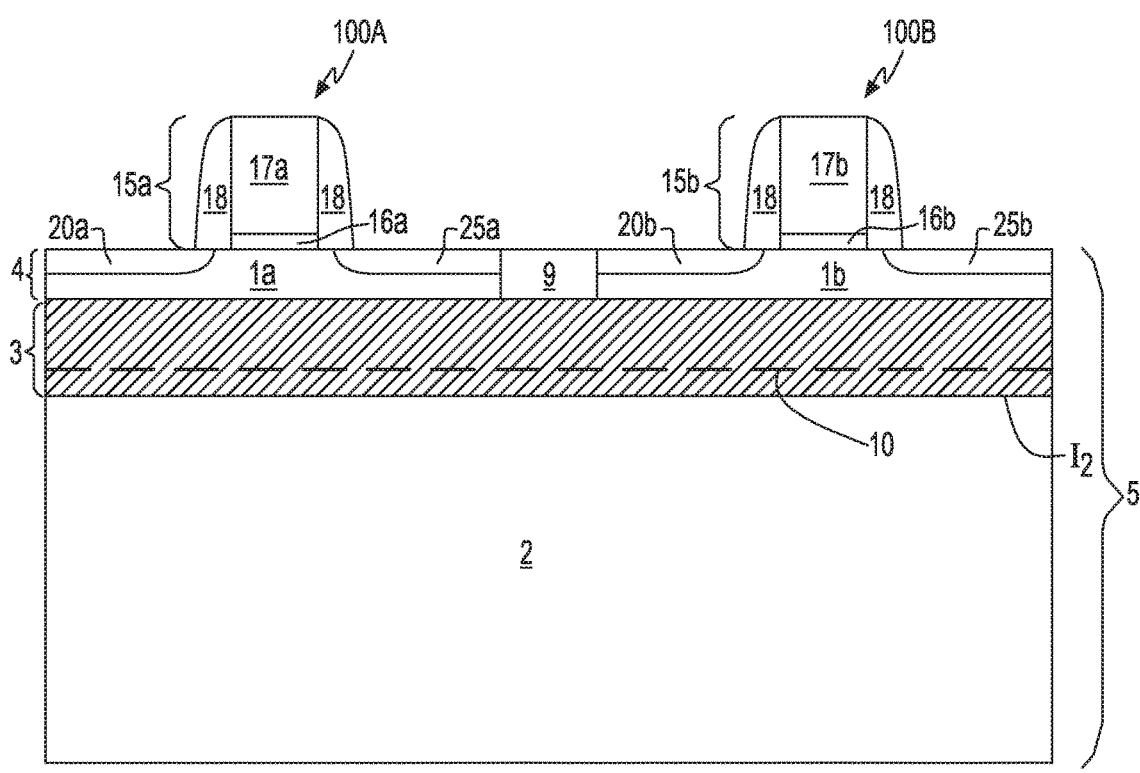
FIG. 2 is a side cross-sectional view of a semiconductor device on an SOI substrate, in which the threshold voltage of the semiconductor device is adjusted by a charge that is stored within a charge storage element of a dielectric layer in the SOI substrate, wherein the charge is provided by hole charge carriers positioned proximate to the interface between the dielectric layer and the base semiconductor layer of the SOI substrate, in accordance with one embodiment of the present disclosure.

FIG. 2 depicts another embodiment of an SOI substrate 5 including an n-type semiconductor device 100A and a p-type semiconductor device 100B, in which the threshold voltage of the semiconductor devices 100A, 100B may be adjusted by a charge produced by hole charge carriers from the base semiconductor layer 2 that are stored within a charge storage element 10 of a dielectric layer 3 in the SOI substrate 5. The semiconductor devices 100A, 100B and the SOI substrate 5 that include the dielectric layer 3 containing the charge storage element 10 has been described above with reference to FIGS. 1A-1C. Therefore, the description of the semiconductor devices 100A, 100B and the dielectric layer 3 containing the charge storage element 10 included above is suitable for the semiconductor devices 100A, 100B and the SOI substrate 5 that are depicted in FIG. 2. As indicated above, the base semiconductor layer 2 of the SOI substrate 5 is doped to a p-type conductivity.

In the embodiment depicted in FIG. 2, the charge is provided by hole carriers that are positioned proximate to the interface I2 between the dielectric layer 3 and the base semiconductor layer 2 of the SOI substrate 5. The charge carriers are tunneling from the base semiconductor layer 2 so the charge storage element 10 needs to be close to the base semiconductor layer 2 to increase tunneling rate. In this embodiment, a large positive voltage is applied to the base so that the hole charge carriers directly tunnel from the base semiconductor layer 2 to the dielectric layer 3 that is containing the charge storage element 10 based on the FN tunneling mechanism.

In one embodiment in which the test electrical property of the n-type semiconductor device 100A indicates that the threshold voltage is greater than the desired threshold voltage for operation, i.e., target threshold voltage, a charge provided by hole charge carriers on the charge storage element 10 may decrease the threshold voltage towards the target threshold voltage. The hole carriers that are contained on the charge storage element 10 can be used to decrease the threshold voltage of the n-type semiconductor device 100A.

In one embodiment and to introduce and trap the hole carriers from the base semiconductor layer 2 on the charge storage element 10 that is underlying the n-type semiconductor device 100A, a voltage of 0.0 volts is applied to the gate structure 15a, a voltage of 0.0 volts is applied to the source and drain regions 20a, 25a, and a voltage greater than 10.0 volts, e.g., 15.0 volts to 20.0 volts, is applied to the base semiconductor layer 2. In one embodiment and to introduce and trap the hole carriers from the base semiconductor layer 2 on the charge storage element 10 that is underlying the p-type semiconductor device 100B, a voltage greater than 0.0 volts is applied to the gate structure 15b, a voltage of 0.0 volts is applied to the source and drain regions 20b, 25b, and a voltage greater than 10.0 volts, e.g., 15.0 volts to 20.0 volts, is applied to the base semiconductor layer 2. It is noted that all voltages disclosed herein are relative. Therefore, instead of 10 V being applied to the base semiconductor layer 2, and 0 V on other terminals, e.g., source and drain regions 20a, 20b, 25a, 25b, and gate structures, e.g., 15a, 15b, you may apply 9 V to the base semiconductor layer 2, and −1.0 V to other terminals, e.g., source and drain regions 20a, 20b, 25a, 25b, and gate structures, e.g., 15a, 15b. In order to directly tunnel hole carriers from the base semiconductor layer 2, the voltage applied to the gate structures 15a, 15b, is typically the same as the voltage applied to the source and drain regions 20a, 20b, 25a, 25b.

The time period that the voltage is applied to the base semiconductor layer 2 is typically dependent upon the degree of threshold voltage adjustment that is required for the n-type semiconductor device 100A and p-type semiconductor device 100B to operate at the target threshold voltage. In one example, in which the adjustment in threshold voltage is to decrease the threshold voltage of an n-type semiconductor device 100B by a voltage ranging from 10 millivolts to 0.2 volts, using the voltages described above, the time period that the voltages are applied to the drain region 25a, the source region 20a, the gate structure 15a, and the base semiconductor layer 2 of the n-type semiconductor device 100A ranges from 1 microseconds to 1 seconds. In another example, in which the adjustment in threshold voltage is to increase the threshold voltage of a p-type semiconductor device 100B by a voltage ranging from 10 milivolts to 0.2 volts, using the voltages described above, the time period that the voltages are applied to the drain region 25b, the source region 20b, the gate structure 15b, and the base semiconductor layer 2 of the p-type semiconductor device 100B ranges from 1 microseconds to 1 second.

In some embodiments, the charge provided by the hole carriers that are produced by base semiconductor layer 2 that are trapped on the charge storage element 10 ranges from $10^{11}$ cm$^{-2}$ to $5 \times 10^{12}$ cm$^{-2}$.

Similar to the embodiments depicted in FIGS. 1A-1C, the test electrical property and the application of the at least one of the voltage to the source region 20a, 20b and the drain region 25a, 25b, the voltage to the gate structure 15a, 15b, and the voltage to the base semiconductor layer 2 of the n-type and p-type semiconductor devices 100A, 100B that are depicted in FIG. 2 may be repeated as many times as necessary so that the charge collected in the charge storage element 10 is suitable to adjust the test electrical property, e.g., threshold voltage, to the target electrical property.

Figure 3:
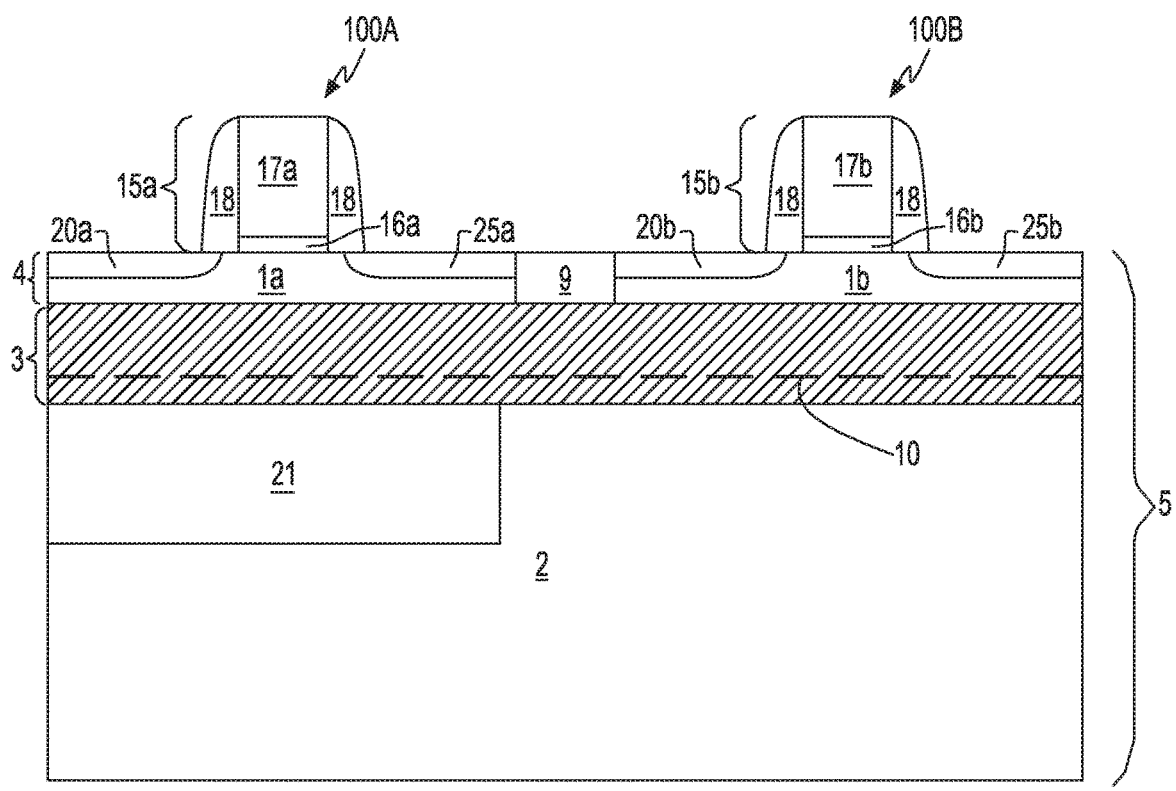
FIG. 3 is a side cross-sectional view of a semiconductor device on an SOI substrate, in which the threshold voltage of the semiconductor device is adjusted by a charge that is stored within a charge storage element of a dielectric layer in the SOI substrate, wherein the charge is provided by electron charge carriers positioned proximate to the interface between the dielectric layer and the base semiconductor layer of the SOI substrate, in accordance with one embodiment of the present disclosure.

FIG. 3 depicts another embodiment of an SOI substrate 5 including an n-type semiconductor device 100A and a p-type semiconductor device 100B, in which the threshold voltage of the semiconductor devices 100A, 100B may be adjusted by a charge produced by electron charge carriers from an n-type well region 21 in the base semiconductor layer 2 that is stored within a charge storage element 10 of a dielectric layer 3 in the SOI substrate 5. The semiconductor devices 100A, 100B and the SOI substrate 5 that includes the dielectric layer 3 containing the charge storage element 10 has been described above with reference to FIGS. 1A-1C. Therefore, the description of the semiconductor devices 100A, 100B and the dielectric layer 3 containing the charge storage element 10 included above is suitable for the semiconductor devices 100A, 100B and the SOI substrate 5 that are depicted in FIG. 2.

Similar to the embodiments described above with reference to FIGS. 1A-1C, the base semiconductor substrate 2 may be doped with a p-type dopant, such as boron, aluminum, gallium and indium. The concentration of the p-type dopant may range from $10^{15}$ atoms/cm$^3$ to $10^{20}$ atoms/cm$^3$. In the embodiment depicted in FIG. 3, the base semiconductor layer 2 may further include an n-type conductivity well 21 that is present underlying at least the n-type semiconductor device 100A. The n-type conductivity well 21 may be formed using ion implantation prior to forming the dielectric layer 3. In some embodiments, the dopant for the n-type conductivity well 21 may be at least one of antimony, arsenic and phosphorous. The concentration of the dopant in the n-type conductivity well 21 may range from $10^{16}$ atoms/cm$^3$ to $5 \times 10^{20}$ atoms/cm$^3$. In another embodiment, the concentration of the dopant in the n-type conductivity well 21 may range from $10^{18}$ atoms/cm$^3$ to $10^{20}$ atoms/cm$^3$.

In embodiment depicted in FIG. 3, the charge is provided by electron charge carriers that are positioned proximate to the interface I2 between the dielectric layer 3 and the base semiconductor layer 2 of the SOI substrate 5. In this embodiment, the electron charge carriers directly tunnel from the n-type conductivity well 21 to the dielectric layer 3 that is containing the charge storage element 10.

In one embodiment in which the test electrical property of at least one of the p-type semiconductor device 100A and the n-type semiconductor device 100B indicates that the threshold voltage is less than the desired threshold voltage for operation, i.e., target threshold voltage, a charge may be provided by electron charge carriers in the charge storage element 10 to increase the threshold voltage of the n-type semiconductor device 100A towards the target threshold voltage. The electron carriers that are contained on the charge storage element 10 can be used to increase the threshold voltage of the n-type semiconductor device 100A.

In one embodiment and to introduce and trap the electron carriers from the n-type conductivity well 21 on the charge storage element 10 that is underlying the n-type semiconductor device 100A, a voltage of 0.0 volts is applied to the gate structure 15a, a voltage of 0.0 volts is applied to the source and drain regions 20a, 25a, and a voltage less than −10.0 volts, e.g., −15.0 volts to −20.0 volts, is applied to the base semiconductor layer 2. In one embodiment and to introduce and trap the hole carriers from the n-type conductivity well 21 on the charge storage element 10 that is underlying the p-type semiconductor device 100B, a voltage of 0.0 volts is applied to the gate structure 15b, a voltage of 0.0 volts is applied to the source and drain regions 20b, 25b, and a voltage less than −10.0 volts, e.g., −15.0 volts to −20.0 volts, is applied to the base semiconductor layer 2. In order to directly tunnel electron charge carriers from the n-type conductivity well 21, the voltage applied to the gate structures 15a, 15b, is typically the same as the voltage applied to the source and drain regions 20a, 20b, 25a, 25b.

The time period that the voltage is applied to the base semiconductor layer 2 is typically dependent upon the degree of threshold voltage adjustment that is required for the n-type semiconductor device 100A and p-type semiconductor device 100B to operate at the target threshold voltage. In one example in which the adjustment in threshold voltage is to increase the threshold voltage of an n-type semiconductor device 100B by a voltage ranging from 10 millivolts to 0.2 volts, using the voltages described above, the time period that the voltages are applied to the source region 20a, the drain region 25a, the gate structure 15a, and the base semiconductor layer 2 of the n-type semiconductor device 100A ranges from 1 microsecond to 1 second. In another example, in which the adjustment in threshold voltage is to decrease the threshold voltage of a p-type semiconductor device 100B by a voltage ranging from 10 millivolts to 0.2 volts, using the voltages described above, the time period that the voltages are applied to the source region 20b, the drain region 25b, the gate structure 15b, and the base semiconductor layer 2 of the p-type semiconductor device 100B ranges from 1 microseconds to 1 seconds.

In some embodiments, the charge density provided by the electron carriers that are produced by the n-type conductivity well 21 that are trapped on the charge storage element 10 ranges from $10^{11}$ cm$^{-2}$ to $5 \times 10^{12}$ cm$^{-2}$.

Similar to the embodiments depicted in FIGS. 1A-1C, the test electrical property and the application of the at least one of the voltage to the source region 20a, 20b and the drain region 25a, 25b, the voltage to the gate structure 15a, 15b, and the voltage to the base semiconductor layer 2 of the n-type and p-type semiconductor devices 100A, 100B that are depicted in FIG. 3 may be repeated as many times as necessary so that the charge collected in the charge storage element 10 is suitable to adjust the test electrical property, e.g., threshold voltage, to the target electrical property.

Figure 4:
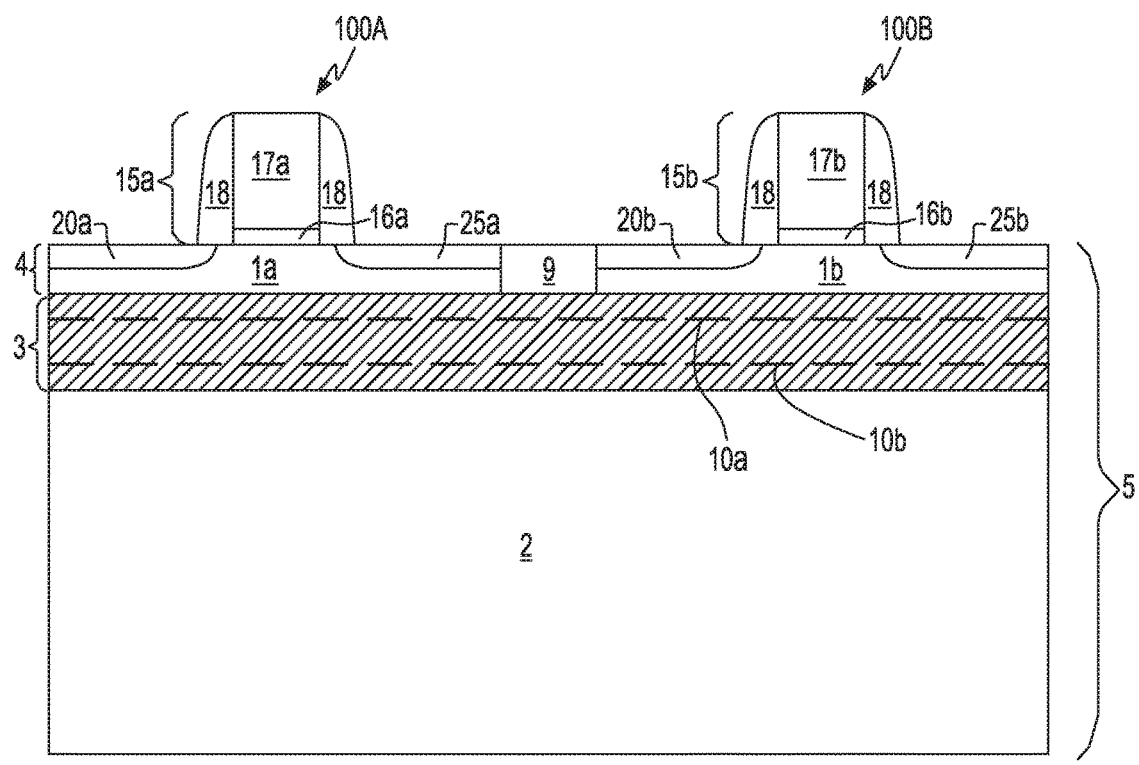
FIG. 4 is a side cross-sectional view of a semiconductor device on an SOI substrate, in which the threshold voltage of the semiconductor device is adjusted by a charge that is stored within a charge storage element of a dielectric layer in the SOI substrate, wherein the charge is provided by at least one of electron charge carriers and hole charge carriers positioned proximate to a first interface between the semiconductor on insulator (SOI) layer and the dielectric layer, and a second interface between the buried dielectric layer and the base semiconductor layer, in accordance with one embodiment of the present disclosure.

FIG. 4 depicts one embodiment, of semiconductor devices, e.g., n-type semiconductor device 100A and p-type semiconductor device 100B, on an SOI substrate 5 that includes a dielectric layer 3 including two charge storage elements 10A, 10B. The first charge storage element 10A is present proximate to the first interface I1 between the SOI layer 4 and the dielectric layer 3. The term "proximate" as used to describe the positioning of the first charge storage element 10A means that the first charge storage element 10A may be present on the interface I1 between the SOI layer 4 and the dielectric layer 3 or may extend a dimension from the SOI layer 4 towards the center of the dielectric layer 3 that is less than or is equal to 20% of the thickness of the dielectric layer 3. The first charge storing element 10A may be formed using any of the structures and methods described above with reference to FIGS. 1A-1C. The second charge storage element 10B is present proximate to the second interface I2 between the base semiconductor layer 2 and the dielectric layer 3. The term "proximate" as used to describe the positioning of the second charge storage element 10B means that the second charge storage element 10B may be present on the interface I2 between the SOI layer and the dielectric layer 3 or may extend a dimension from the base semiconductor layer 2 towards the center of the dielectric layer 3 that is less than or equal to 20% of the thickness of the dielectric layer 3. The second charge storing element 10b may be formed using any of the structures and methods described above with reference to FIGS. 2 and 3.

Figure 5:
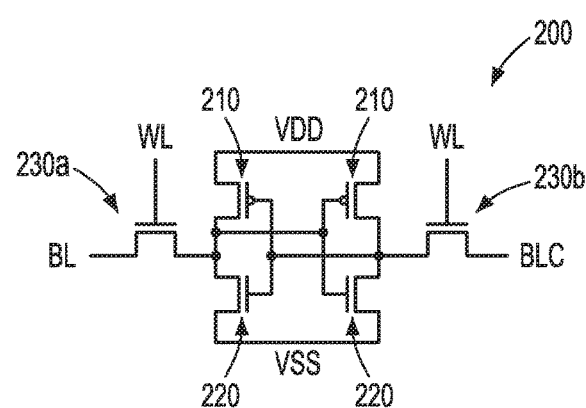
FIG. 5 is a circuit diagram of an SRAM device including semiconductor devices that have a charge storage element present in the dielectric layer of the SOI substrate on which the semiconductor devices are formed, in accordance with one embodiment of the present disclosure.

FIG. 5 is a circuit diagram of a static random access memory (SRAM) device 200 including semiconductor devices that have a charge storage element present in the buried dielectric layer of the SOI substrate on which the semiconductor devices of the SRAM device 200 are formed. The SOI substrate that includes the dielectric layer having the charge storage layer on which the SRAM device 200 is formed is similar to the charge storage layer 10 of the dielectric layer 3 that is described above with reference to FIGS. 1-4. Therefore, the description of the dielectric layer 3 and the charge storage layer 10 that corresponds to FIGS. 1-4 is equally applicable to the dielectric layer having the charge storage layer that is employed in the SRAM device 200 that is depicted in FIG. 5.

An SRAM device 200 is a type of semiconductor memory where the term "static" indicates that, unlike dynamic RAM (DRAM), the semiconductor memory does not need to be refreshed. Each bit stored in an SRAM is stored on four semiconductor devices, i.e., transistors, that form two cross-coupled inverters, which provide the storage cell of the device. This storage cell may have two stable states which are used to denote "0" and "1". The four semiconductor devices that provide the storage cell may include two pull up transistors 210 and two pull down transistors 220. In one example, each pair of the pull-up and pull-down transistors form a CMOS inverters. The two CMOS inverters in the cell are cross-coupled to form a positive feedback loop. So, a voltage that is present on the left and right nodes of the cell will remain unchanged as long as the cell is connected to the power supply. Each of the pull up transistors 210 are p-type field effect transistors (pFETs) similar to the p-type semiconductor devices 100B that are described above with reference to FIGS. 1A-4. Each of the pull down transistors 220 are n-type field effect transistors (nFETs) similar to the n-type semiconductor devices 100A that are described above with reference to FIGS. 1A-4.

The SRAM device 200 further includes pass gate transistors 230a, 230b that enable access to the storage cell, i.e., pull up transistors 210 and pull down transistors 220, during read and write operations. A first pass gate transistor 230a is in electrical communication to the word line WL through its gate structure, and is in electrical communication with the bit line BL through one of the source region and the drain region of the first pass gate transistor 230a. The second pass gate transistor 230b is in electrical communication to the word line WL through its gate structure, and is in electrical communication with the bit line complement BLC through one of the source region and the drain region of the second pass gate transistor 230b. Each of the pass gate transistors 230a, 230b are n-type field effect transistors (nFETs) similar to the n-type semiconductor devices 100A that are described above with reference to FIGS. 1A-4.

Before a charge is introduced to the charge storage element of the buried dielectric layer that is underlying each of the semiconductor devices 210, 220, 230a, 230b of the SRAM 200, a test electrical property is measured to determine the performance of the semiconductor devices 210, 220, 230a, 230b in the SRAM device 200. In one embodiment, the test electrical property is the threshold voltage ($V_T$), on current (I-on), or off current (I-off) for at least one of the semiconductor devices 210, 220, 230a, 230b in the SRAM device 200. Typically, the test electrical property is the threshold voltage or can be correlated to the threshold voltage for at least one of the semiconductor devices 210, 220, 230a, 230b in the SRAM device 200. The target electrical property is the standard for device performance at which the semiconductor devices 210, 220, 230a, 230b are operating at their optimum level. The target electrical property is selected by device type and application. Similar to the test electrical property, the target electrical property may be the threshold voltage of at least one of the semiconductor devices 210, 220, 230a, 230b in the SRAM device 200, or may be a measurement that can be correlated to the threshold voltage of at least one of the semiconductor devices 210, 220, 230a, 230b of the SRAM device 200.

If the test electrical property is not within specification for the desired performance of at least one of the semiconductor devices 210, 220, 230a, 230b of the SRAM device 200, a charge may be stored in the charge storage element to adjust the devices' performance. The charge is introduced to the charges storage element by biasing the semiconductor device 210, 220, 230a, 230b in which the adjustment is desired. For example, to collect charge in the charge storage element, a voltage may be applied to at least one the bit line (BL) to source/drain region of a first pass gate transistor 230a; a voltage to the bit line complement (BLC) to the source/drain region of the second pass gate transistor 230b; a voltage to a word line (WL) to the gate structures of the first and second pass gate transistors 230a, 230b; a positive supply voltage (VDD) to at least one of the two pull up transistors 210; a negative supply voltage (VSS) to the at least one of the two pull down transistors 220; and a voltage to the substrate. In one embodiment, application of the above voltages in the SRAM device 200 results in a charge that is collected in the charge storage element that may adjust the test electrical property of at least one of the pull up transistors 210, the pull down transistors 220, the first pass gate transistor 230a, and the second pass gate transistor 230b towards a target electrical property.

In one embodiment, when the measurement of the test electrical property indicates that the threshold voltage of the n-type pull down transistors 220, and the n-type pass gate transistors 230a, 230b is below the target threshold voltage, the threshold voltage of the n-type pull down transistors 220 and the n-type pass gate transistors 230a, 230b, may be increased by storing hot electron carriers on the charge storage element. To introduce a charge of hot electron carriers on the charge storage element that is present within the dielectric layer of the substrate on which the SRAM device 200 is formed, a positive voltage, e.g., 1 volt, is applied to the wordline WL to the first n-type pass transistor 230a and the second n-type pass transistor 230b; the negative voltage supply (VSS) to the at least two n-type pull down transistors 220 ranges from −1.0 volt to −2.0 volts; and the voltage applied to the base semiconductor substrate is greater than 10 volts, e.g., 15 volts to 20 volts. To increase the threshold voltage of the n-type pull down transistor 220, and the n-type pass gate transistor 230a, 230b, the voltage applied to the bit line (BL) that is electrically connected to the first access gate transistor 230a, and the voltage applied to the bit line complement (BLC) that is electrically connected to the second gate transistor 230b, is typically 0.0 volts. Additionally, the positive supply voltage (VDD) to the p-type pull up transistors 210 is typically disconnected, i.e., floating.

In one embodiment, the negative voltage supply (VSS) to the at least two n-type pull down transistors 220 ranges from −1.1 volts to −1.5 volts. In yet another embodiment, the negative voltage supply (VSS) to the at least two n-type pull down transistors 220 ranges from −1.2 volts to −1.3 volts.

The time period that the above bias is applied to the SRAM device 200 is typically dependent upon the degree of threshold voltage adjustment that is required for the n-type pull down transistors 220, and the n-type pass gate transistors 230a, 230b. In one example, in which the adjustment in threshold voltage is to increase the threshold voltage of one of the n-type pull down transistors 220 and the n-type pass gate transistors 230a, 230b by a voltage ranging from 10 millivolts to 0.2 volts, using the bias described above, the time period that the voltages are applied to the SRAM device 200 ranges from 1 microsecond to 1 second. In one embodiment, the threshold voltage of the semiconductor devices 210, 220, 230a, 230b on one side of the SRAM device 200 is adjusted by grounding one of the bit line BL or bit line complement (BLC), floating one the bit line BL or bit line complement (BLC), or by grounding one of the left or right word lines.

When the measurement of the test electrical property indicates that the threshold voltage of the p-type pull up transistors 210 are below the target threshold voltage, the threshold voltage of the p-type pull up transistors 210 may be increased by storing HOT hole carriers on the charge storage element. To introduce a charge of HOT hole carriers on the charge storage element that is present within the dielectric layer of the substrate on which the SRAM device 200 is formed, a positive voltage, e.g., 1 volt, is applied to the wordline WL to the first n-type pass transistor 230a and the second pass transistor 230b; the positive voltage supply (VDD) to the at least two p-type pull up transistors 210 ranges from 1.0 volt to 2.0 volts; and the voltage applied to the base semiconductor substrate is less than −10 volts, e.g., −15 volts to −20 volts. To increase the threshold voltage of the p-type pull up transistor 210, the voltage applied to the bit line (BL) that is electrically connected to the first access gate transistor 230a, and the voltage applied to the bit line complement (BLC) that is electrically connected to the second gate transistor 230b, is typically 0.0 volts. Additionally, the negative supply voltage (VSS) to the n-type pull down transistors 220 is typically disconnected, i.e., floating.

In one embodiment, the positive voltage supply (VDD) to the at least two p-type pull up transistors 210 ranges from 1.1 volts to 1.5 volts. In yet another embodiment, the positive voltage supply (VDD) to the at least two p-type pull up transistors 210 ranges from 1.2 volts to 1.3 volts.

The time period that the above bias is applied to the SRAM device 200 is typically dependent upon the degree of threshold voltage adjustment that is required for the p-type pull up transistors 210. In one example, in which the adjustment in threshold voltage is to increase the threshold voltage of one of the p-type pull up transistors 220 by a voltage ranging from 10 millivolts to 0.2 volts, using the bias described above, the time period that the voltages are applied to the SRAM device 200 ranges from 1 microsecond to 1 second.

When the measurement of the test electrical property indicates that the threshold voltage of the n-type pull down transistors 220, and the n-type pass gate transistors 230a, 230b is greater the target threshold voltage, the threshold voltage of the n-type pull down transistors 220, and the n-type pass gate transistors 230a, 230b, may be decreased by storing avalanche hole carriers on the charge storage element. To introduce a charge of avalanche hole carriers on the charge storage element that is present within the dielectric layer of the substrate on which the SRAM device 200 is formed, a positive voltage, e.g., 1 volt, is applied to the wordline WL to the first n-type pass transistor 230a and the second pass transistor 230b; the negative voltage supply (VSS) to the at least two n-type pull down transistors 220 ranges from −1.0 volt to −2.0 volts; and the voltage applied to the base semiconductor substrate is less than −10 volts, e.g., −15 volts to −20 volts. To decrease the threshold voltage of the n-type pull down transistor 220, and the n-type pass gate transistor 230a, 230b, the voltage applied to the bit line (BL) that is electrically connected to the first access gate transistor 230a, and the voltage applied to the bit line complement (BLC) that is electrically connected to the second gate transistor 230b, is typically 0.0 volts. Additionally, the positive supply voltage (VDD) to the p-type pull up transistors 210 is typically disconnected, i.e., floating.

In one embodiment, the negative voltage supply (VSS) to the at least two n-type pull down transistors 220 ranges from −1.1 volts to −1.5 volts. In yet another embodiment, the negative voltage supply (VSS) to the at least two n-type pull down transistors 220 ranges from −1.2 volts to −1.3 volts.

The time period that the above bias is applied to the SRAM device 200 is typically dependent upon the degree of threshold voltage adjustment that is required for the n-type pull down transistors 220, and the n-type pass gate transistors 230a, 230b. In one example, in which the adjustment in threshold voltage is to decrease the threshold voltage of one of the n-type pull down transistors 220 and the n-type pass gate transistors 230a, 230b by a voltage ranging from 10 millivolts to 0.2 volts, using the bias described above, the time period that the voltages are applied to the SRAM device 200 ranges from 1 microseconds to 1 second.

When the measurement of the test electrical property indicates that the threshold voltage of the p-type pull up transistors 210 are greater the target threshold voltage, the threshold voltage of the p-type pull up transistors 210 may be decreased by storing avalanche electron carriers on the charge storage element. To introduce a charge of avalanche electron carriers on the charge storage element that is present within the dielectric layer of the substrate on which the SRAM device 200 is formed, a positive voltage, e.g., 1 volt, is applied to the wordline WL to the first n-type pass transistor 230a and the second pass transistor 230b; the positive voltage supply (VDD) to the at least two p-type pull up transistors 220 ranges from −1.0 volt to −2.0 volts; and the voltage applied to the base semiconductor substrate is greater than 10 volts, e.g., 15 volts to 20 volts. To increase the threshold voltage of the p-type pull up transistor 210, the voltage applied to the bit line (BL) that is electrically connected to the first access gate transistor 230a, and the voltage applied to the bit line complement (BLC) that is electrically connected to the second gate transistor 230b, is typically 0.0 volts. Additionally, the negative supply voltage (VSS) to the n-type pull down transistors 220 is typically disconnected, i.e., floating.

In one embodiment, the positive voltage supply (VDD) to the at least two p-type pull up transistors 210 ranges from 1.1 volts to 1.5 volts. In yet another embodiment, the positive voltage supply (VDD) to the at least two p-type pull up transistors 210 ranges from 1.2 volts to 1.3 volts.

The time period that the above bias is applied to the SRAM device 200 is typically dependent upon the degree of threshold voltage adjustment that is required for the p-type pull up transistors 210. In one example, in which the adjustment in threshold voltage is to decrease the threshold voltage of one of the p-type pull up transistors 220 by a voltage ranging from 10 millivolts to 0.2 volts, using the bias described above, the time period that the voltages are applied to the SRAM device 200 ranges from 1 microseconds to 1 second.

Although, FIG. 5 only depicts the circuit diagram of one SRAM device 200, the present disclosure is applicable to a plurality of SRAM devices each having a circuit diagram that is similar to the one illustrated in FIG. 5. In one embodiment, the threshold voltage for a plurality of SRAM devices 200 may be adjusted by measuring the electrical properties of a representing cell next to a block of cells, which has its nodes available for measurement (standby current, read margin, write margin, read current, etc), and then adjusting the threshold voltage of the block of cells using the electrical properties measured from the representing cell as a point of reference. Each cell may be an SRAM device. In this embodiment, it is assumed that the representing cell will have the same electrical characteristics as each of the cells, e.g., SRAM devices, in the block. In another embodiment, measurements are taken on the entire block, for example the standby current of the whole block, which is a function of the threshold voltage, or the failure rate, which is typically a function of mismatch in the threshold voltage between left and right half-cell or between pull-up and pull-down cells.

In response to the measurements taken from the representing cell or the measurements taken from the block of cells, a charge may be stored on the charge storage element that is underlying each of the cells within the block to adjust the threshold voltage for each of the cells. For example, the charge that may be stored on the charge storage element can be produced by applying the appropriate bias to the bit-line voltage (BL), bit-line compliment (BLC), word line (WL), the positive voltage supply (VDD), and the negative voltage supply (VSS) as described above with reference to FIG. 5.

While the methods and structures disclosed herein have been particularly shown and described with respect to preferred embodiments thereof, it will be understood by those skilled in the art that the foregoing and other changes in forms and details may be made without departing from the spirit and scope of the present disclosure. It is therefore intended that the present disclosure is not limited to the exact forms and details described and illustrated, but fall within the scope of the appended claims.

What is claimed is:

1. A method of adjusting threshold voltage in a memory device comprising:
providing a static random access memory (SRAM) device comprising at least two p-type pull up transistors, at least two n-type pull down transistors, a first pass gate transistor and a second pass gate transistor on a substrate, wherein the at least two p-type pull up transistors and the at least two n-type pull down transistors provide a storage cell, and the first and the second pass gate transistors provide an access to the storage cell, and wherein the at least two p-type pull up transistors and the at least two n-type pull down transistors overlie a charge storage element present in a dielectric layer of the substrate;
measuring a test electrical property of at least one of the at least two p-type pull up transistors and the at least two n-type pull down transistors; and
applying at least one of a voltage to a bit line (BL) that is electrically connected to source/drain regions of the first pass gate transistor, a voltage to a bit line complement (BLC) that is electrically connected to source/drain regions of the second pass gate transistor, a voltage to a word line (WL) that is electrically connected to gate structures of the first and the second pass gate transistors, a positive supply voltage to at least one of the at least two p-type pull up transistors and a negative supply voltage to at least one of the at least two n-type pull down transistors, and a voltage to the substrate, wherein a charge is collected in the charge storage element of the dielectric layer for a time period that adjusts the test electrical property of the at least one of the at least two p-type pull up transistors and the at least two n-type pull down transistors towards a target electrical property.

2. The method of claim 1, further comprising:
measuring the test electrical property for a first time before the applying the at least one of the voltage to the BL, the voltage to the BLC, the voltage to the WL, the positive supply voltage to the at least one of the at least two p-type pull up transistors and the negative supply voltage to the at least one of the at least two n-type pull down transistors, and the voltage to the substrate; and
measuring the test electrical property for at least a second time after at least a portion of the charge is collected in the charge storage element to determine if the test electrical property is equal to the target electrical property.

3. The method of claim 2, wherein when the test electrical property that is measured the second time is not equal to the target electrical property, the method further comprises:
applying at least one of the voltage to the BL, the voltage to the BLC, the voltage to the WL, the positive supply voltage to the at least one of the at least two p-type pull up transistors and the negative supply voltage to the at least one of the at least two n-type pull down transistors, and the voltage to the substrate for at least another time period until a charge is collected in the charge storage element that adjusts the test electrical property of the at least one of the at least two p-type pull up transistors and the at least two n-type pull down transistors to the target electrical property.

4. The method of claim 1, wherein the test electrical property is a test threshold voltage, a test on current (I-on), a test off current (I-off) or a combination thereof.

5. The method of claim 1, wherein each of the first pass gate transistor and the second pass gate transistor is of an n-type conductivity.

6. The method of claim 5, wherein when the test electric property of at least one of the at least two n-type pull down transistors, the first pass gate transistor and the second pass gate transistors is below the target threshold voltage, the applying the at least one of the voltage to the BL, the voltage to the BLC, the voltage to the WL, the positive supply voltage to the at least one of the at least two p-type pull up transistors and the negative supply voltage to the at least one of the at least two n-type pull down transistors, and the voltage to the substrate comprises:
applying a positive voltage to the WL;
applying a negative voltage supply ranging from −1.0 V to −2.0 V to the at least two n-type pull down transistors;
applying a voltage greater than 10 V to the substrate;
applying 0 V to the BL;
applying 0 V to the BLC; and
disconnecting the positive supply voltage to the at least two p-type pull up transistors.

7. The method of claim 6, wherein after the applying the voltages, hot electron carriers are stored in the charge storage element.

8. The method of claim 5, wherein when the test electric property of at least one of the at least two p-type pull up transistors is below the target threshold voltage, the applying the at least one of the voltage to the BL, the voltage to the BLC, the voltage to the WL, the positive supply voltage to the at least one of the at least two p-type pull up transistors and the negative supply voltage to the at least one of the at least two n-type pull down transistors, and the voltage to the substrate comprises:
applying a positive voltage to the WL;
applying a positive voltage supply ranging from 1.0 V to 2.0 V to the at least two p-type pull up transistors;
applying a voltage less than −10 V to the substrate;
applying 0 V to the BL;
applying 0 V to the BLC; and
disconnecting the negative supply voltage to the at least two n-type pull down transistors.

9. The method of claim 8, wherein after the applying the voltages, hot hole carriers are stored in the charge storage element.

10. The method of claim 5, wherein when the test electric property of at least one of the at least two n-type pull down transistors, the first pass gate transistor and the second pass gate transistors is greater than the target threshold voltage, the applying the at least one of the voltage to the BL, the voltage to the BLC, the voltage to the WL, the positive supply voltage to the at least one of the at least two p-type pull up transistors and the negative supply voltage to the at least one of the at least two n-type pull down transistors, and the voltage to the substrate comprises:
applying a positive voltage to the WL;
applying a negative voltage supply ranging from −1.0 V to −2.0 V to the at least two n-type pull down transistors;
applying a voltage less than −10 V to the substrate;
applying 0 V to the BL;
applying 0 V to the BLC; and disconnecting the positive supply voltage to the at least two p-type pull up transistors.

11. The method of claim 10, wherein after the applying the voltages, avalanche hole carriers are stored in the charge storage element.

12. The method of claim 5, wherein when the test electric property of at least one of the at least two p-type pull up transistors are greater the target threshold voltage, the applying the at least one of the voltage to the BL, the voltage to the BLC, the voltage to the WL, the positive supply voltage to the at least one of the at least two p-type pull up transistors and the negative supply voltage to the at least one of the at least two n-type pull down transistors, and the voltage to the substrate comprises:
applying a positive voltage to the WL;
applying a positive voltage supply ranging from 1.0 V to 2.0 V to the at least two p-type pull up transistors;
applying a voltage greater than 10 V to the substrate;
applying 0 V to the BL;
applying 0 V to the BLC; and
disconnecting the negative supply voltage to the at least two n-type pull down transistors.

13. The method of claim 12, wherein after the applying the voltages, avalanche electron carriers are stored in the charge storage element.

14. The method of claim 1, wherein the substrate is a semiconductor on insulator (SOI) substrate comprising, from bottom to top, a base semiconductor layer, the dielectric layer and an SOI layer, wherein the SRAM device is formed on the SOI layer.

15. The method of claim 14, wherein the charge storage element comprises a first charge storage element located proximate to a first interface between the SOI layer and the dielectric layer and a second charge storage element located proximate to a second interface between the base semiconductor layer and the dielectric layer.

16. The method of claim 15, wherein each of the first charge storage element and the second charge storage element comprises a high-k dielectric material or a nano-crystal material.

17. The method of claim 16, wherein the high-k dielectric material comprises aluminum nitride (AlN), aluminum gallium nitride (AlGaN), aluminum oxide ($Al_2O_3$), hafnium oxide ($HfO_2$), hafnium oxynitride (HfON) or zirconium oxynitride (ZrON).

18. The method of claim 16, wherein the nano-crystal material comprises nanocrystalline silicon.

19. The method of claim 15, wherein each of the first charge storage element and the second charge storage element comprises a nitride layer.

20. The method of claim 15, wherein a distance between the first charge storage element and the first interface is less than or equal to 20% of a thickness of the dielectric layer, and a distance between the second charge storage element and the second interface is less than or equal to 20% of the thickness of the dielectric layer.

* * * * *